United States Patent
Crain et al.

(10) Patent No.: US 6,781,460 B2
(45) Date of Patent: Aug. 24, 2004

(54) LOW POWER LOW VOLTAGE DIFFERENTIAL SIGNAL RECEIVER WITH IMPROVED SKEW AND JITTER PERFORMANCE

(75) Inventors: Ethan A. Crain, Portland, ME (US); Pravas Pradhan, South Portland, ME (US)

(73) Assignee: Fairchild Semiconductor Corp., So. Portland, ME (US)

( * ) Notice: Subject to any disclaimer, the term of this patent is extended or adjusted under 35 U.S.C. 154(b) by 122 days.

(21) Appl. No.: 10/282,569

(22) Filed: Oct. 29, 2002

(65) Prior Publication Data

US 2004/0080367 A1 Apr. 29, 2004

(51) Int. Cl.[7] ................................ H03F 3/45
(52) U.S. Cl. ...................... 330/253; 330/257
(58) Field of Search ........................ 330/253, 255, 330/257, 258; 327/359

(56) References Cited

U.S. PATENT DOCUMENTS

| | | | |
|---|---|---|---|
| 5,894,245 A | * | 4/1999 | Cho .......................... 330/253 |
| 6,052,025 A | * | 4/2000 | Chang et al. ............... 330/253 |
| 6,150,883 A | * | 11/2000 | Ivanov ....................... 330/253 |
| 6,236,269 B1 | | 5/2001 | Hojabri |
| 6,252,432 B1 | | 6/2001 | Freitas |
| 6,275,073 B1 | | 8/2001 | Tokuhiro |

* cited by examiner

Primary Examiner—Henry Choe
(74) Attorney, Agent, or Firm—Cesari and McKenna, LLP; Edwin H. Paul, Esq.

(57) ABSTRACT

A folder common cascode circuit with symmetric parallel signal paths from the differential inputs to the differential outputs provides a low skew, low jitter, low power differential amplifier. The signal paths on either side of the differential amplifier are made equal with equal loads along each path. Pairs of complementary NMOS and PMOS transistor pairs with parallel complementary biasing stacks on the output cascode circuitry maintain symmetrical parallel signal paths, amplification and impedance loading from differential input to differential output. Output voltage translating inverters provide a higher voltage level output signal while maintaining low skew and jitter.

5 Claims, 2 Drawing Sheets

LOW POWER LOW VOLTAGE DIFFERENTIAL SIGNAL RECEIVER WITH IMPROVED SKEW AND JITTER PERFORMANCE

BACKGROUND OF THE INVENTION

1. Field of the Invention

The present invention relates to interface circuits, and more particularly to translating interface circuits and receivers, and even more particularly to high speed interface receivers with low voltage differential input signals (LVDS) and complementary, low skew CMOS differential output signals.

2. Background Information

Low voltage differential signals are common for high speed signal transmission. Saturation effects are avoided and power is limited thereby encouraging the use of LVDS, and, since low voltage signals are prone to noise, differential signals, where the noise is common to both signals, generally will overcome this problem.

However, since common mode signals will occur, LVDS circuits are designed to accept differential signals that ride on a common mode level that, in the best case will range from the low power, or ground, rail to the Vcc power rail.

Designs for such translators strive for low power dissipation, increased speed, reduced edge delays, reduced jitter, reduced skew, and for efficient in the use of die area. Often the output of the receiver requires a TTL or CMOS logic level, so such designs also strive for high to low rail to rail outputs.

U.S. Pat. Nos. 6,275,073 B1, 6,252,432 B1 and 6,236,269 B1 set out a high speed differential input circuits that operates over a wide input common mode range but each provides only a single ended output. In these patents the differential input signals are each input to the gates of both an NMOS and a PMOS transistor so that NMOS will handle common mode voltages up to within about 200 millivolts of the high power rail and the PMOS down to within about 200 millivolts of the ground.

Notice that in the above prior art patents, the circuitry shown is not symmetrical. That is the differential inputs signal paths to the outputs is not the same for the two inputs. This lack of symmetry adds to the skew and jitter of these circuits.

There is a need to provide in many applications both a signal and its complement. The prior art circuits require a series inverter delay to complement the signal. In such cases the complement signal is offset from the output signal by the gate delay on each signal edge. The complement will have an inherent skew and non-symmetry due to the need for a series inverter.

There is a need for a differential low voltage receiver with a wide common mode range that provides complementary outputs with improved skew and jitter performance.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

SUMMARY OF THE INVENTION

In view of the foregoing background discussion, the present invention provides a high speed, low power, differential receiver that provides complementary TTL and CMOS compatible differential outputs, and that demonstrates lower skew and jitter, and that accepts rail to rail common mode inputs while providing rail to rail complementary outputs.

Use of precise symmetry, duplicated circuitry and therefore loads along each of the differential input signal paths and full differential circuitry throughout the invention provides for the objective operational improvements of the present invention. Inspection of a preferred embodiment in FIG. 3 clearly shows this symmetry.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
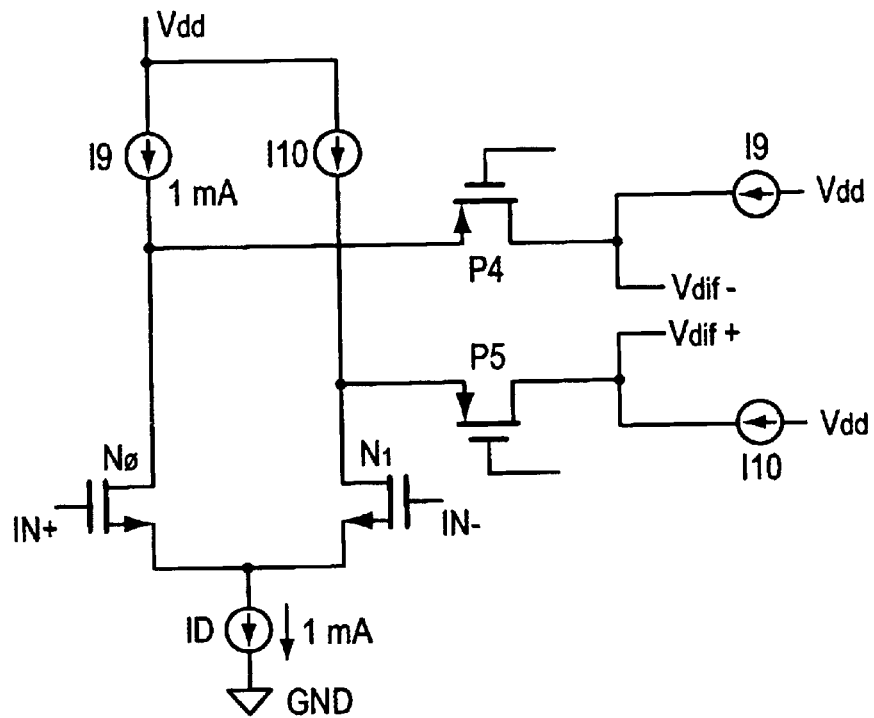
FIG. 1 is partial schematic of a folded cascode circuit with NMOS input transistors.
Figure 2:
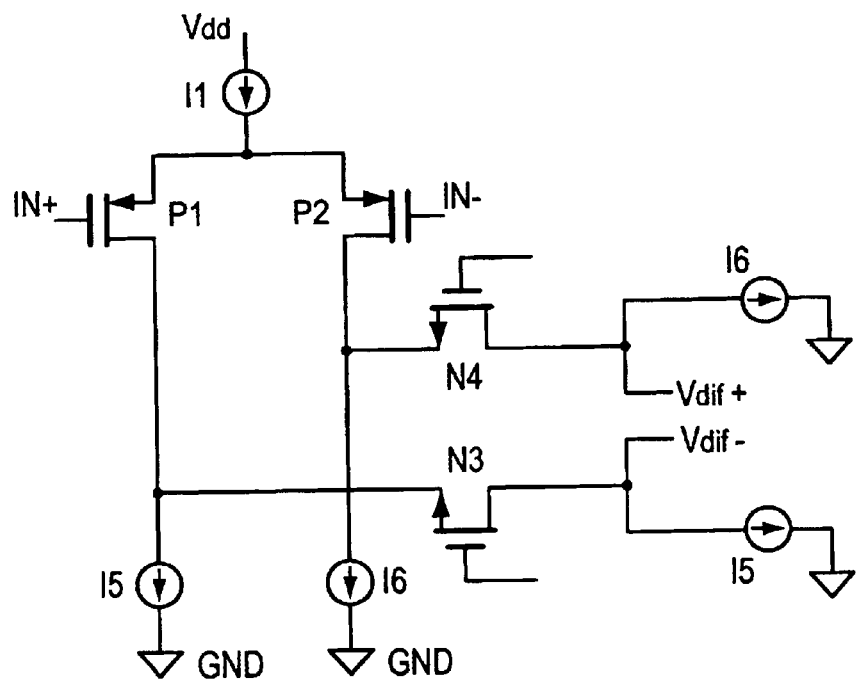
FIG. 2 is partial schematic of a folded cascode circuit with PMOS input transistors.

FIG. 1 shows a cascode circuit with a differential input composed of IN+ and IN− connected to the gates of NMOS's N0 and N1, respectively. The drains of these NMOS transistors are fed into the sources of PMOS's P4 and P5, respectively, as in a typical cascode circuit. Cascode circuits had the beneficial characteristic of a differential voltage signal input to high impedance gates (or bases, in bipolar circuits) of the NMOS transistors causing a output differential current from the high impedance drains that are fed into low impedances. If there were a resistance or other such high impedance loads on the drains, an inverted voltage signal would appear at the drains magnifying the Miller capacitance from gate to drain and, thereby, limiting the circuit's frequency range. Since the load on the drains is the low impedance sources (or emitters) little or no voltage signal appears at the drains of the NMOS's and the Miller capacitance is not magnified. However, a preferred embodiment of the present invention, as in FIGS. 1 and 2 shows a topology of the cascode common source load transistors shown folded to the right and current sources, I9 and I10 in FIG. 1 and I5 and I6 in FIG. 2, making vertical connections to the Vdd and ground, respectively. This circuit configuration lends its name to the circuit as "folded cascode." "Designs of Analog CMOS Integrated Circuits" by Behzad Razavi published by McGraw Hill is a good reference describing folded cascode circuitry and is hereby incorporated herein by reference.

The differential output voltage signal (Vdif+, Vdif−), in FIG. 1 is taken between the drains of P4 and P5. In FIG. 1 the current sources I0, I9 and I10 are used to bias the transistors. In a preferred embodiment I9 and I10 provide half the bias current, I0, for the input NMOS's with the other half going to the P4 and P5. Also, as practitioners in the art will understand, the current sources are MOS devices configured as mirrored current sources.

FIG. 2 is a parallel folded cascode circuit to that of FIG. 1 but with the opposite polarity—using a PMOS input pair. The input transistors are PMOS P1 and P2 with their drains connected to current sources I5 and I6, respectively, and to low impedance sources of N3 and N4, respectively.

The input NMOS pair of FIG. 1 allows the common mode input voltage to run from at least Vdd/2 to Vdd, and the PMOS pair of FIG. 2 allows the common mode input voltage to run from at least Vdd/2 to gnd. This parallel combination of differential input circuits allows the input common mode voltage to traverse from ground to Vdd. This can be seen from FIG. 1 where if IN+ and IN− were at both at Vdd, the current sources I9 and I10 would still operate supplying half their currents to I0 and the other half to P4 and P5. As it evident from the schematic, if there were a differential input voltage the currents from I9 and I10 would unequally supply half their total currents for I0 and the remaining currents to P4 and P5 in proportion to the differential input signal value. Similar operation exists for the PMOS circuit of FIG. 2, with the resulting operation allowing the full rail to rail input common mode operation.

Notice that in both FIG. 1 and FIG. 2 the outputs are Vdif+ and Vdif−. In fact N3 and N4 provide an active load for P4 and P5 with N0 and N1 as the operating differential input stage. Correspondingly, P4 and P5 are active loads for N3 and N4 with P0 and P1 as the operating differential input stage. When input common mode goes up to less than Vdd−(Vtp+Vdsat), P1 and P2 stop working but N1 and N2 still operate and amplify the input. Similarly when input common mode goes to less than gnd+(Vtn+Vdsat), N1 and N2 stop working but P1 and P2 still operate and amplify the input.

Figure 3:
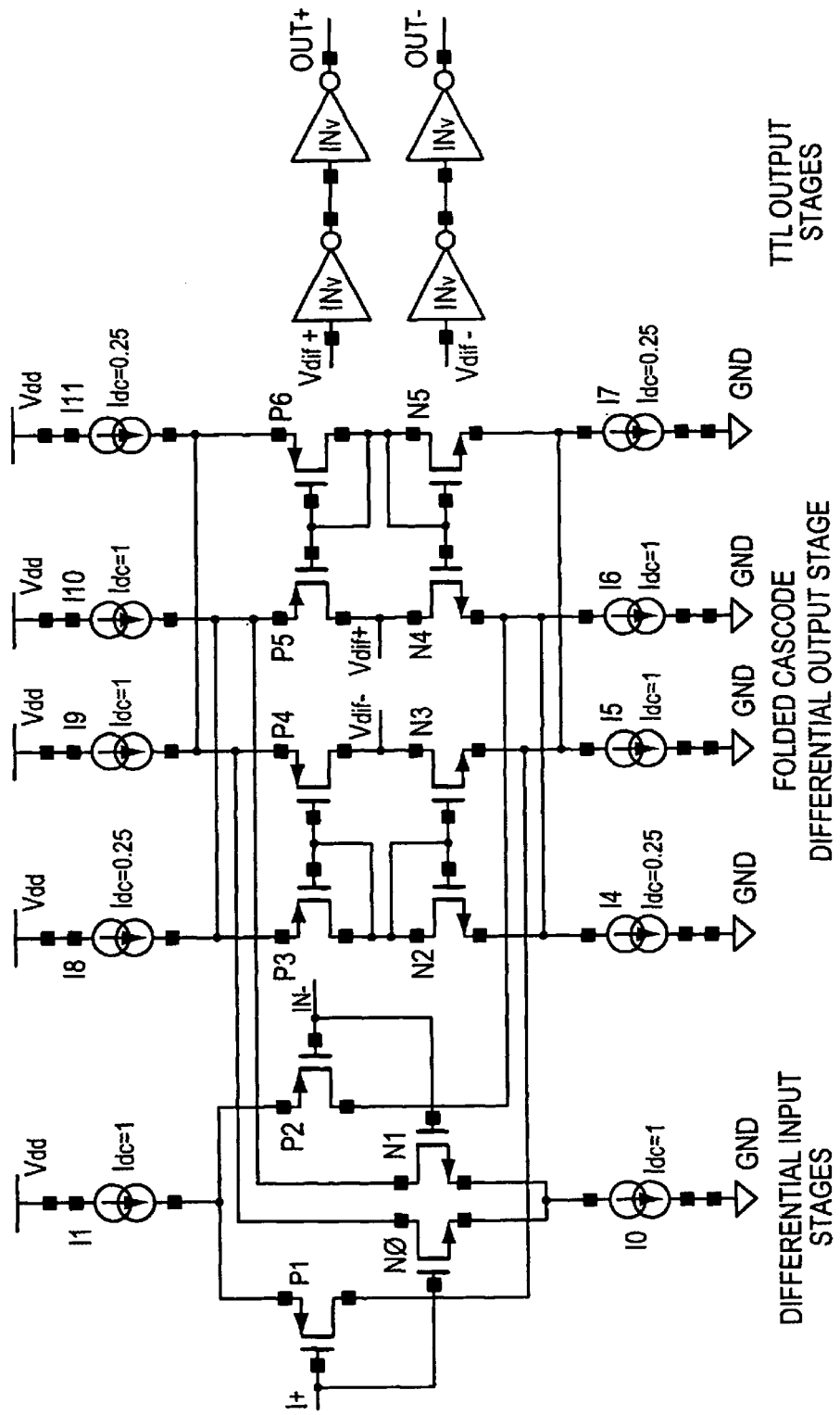
FIG. 3 is a full schematic incorporating FIGS. 1 and 2 of an embodiment of the present invention.

FIG. 3 circuit shows a more complete schematic drawn to show the parallel symmetrical nature of the circuitry and biasing. P4 and P5 and N3 and N4, respectively, form low impedance loads with their respective sources connected the drains of the input tranistors, and active loads on each other with their drains connected to each other. As can be seen from FIGS. 3 and 4, there is a parallel symmetrical nature to the entire circuit.

From inspection of FIG. 3, the transistor pair P3 and N2 is symmetrical to P6 and N5. P3 and N2 providing biasing to P4 and N3. Similarly P6 and N5 provides biasing to P5 and N4. Moreover, the pair P4/N3 is a symmetrical duplicate of the P5/N4 biasing pair. The symmetric parallel nature of this circuitry is verified by inspection.

The overall circuit symmetry provides low skew and low jitter performance with the differential output Vdif+/Vdif− being a true differential output. These differential outputs can be passed through identical inverters, as in FIG. 5, to buffer the outputs while maintaining the low skew and jitter. Here "symmetrical" refers to the parallel circuitry in either the IN+ or the IN− circuits being identical mirrors of each other including signal path lengths. That is, N0 is an identical mirror of N1, and P4 of P5 ,and I9 of I10, and N3 of N4, as so on, and the signal path length from IN+ through to OUT− is arranged to be equal to that from IN− to OUT+.

Still referring to FIG. 3, the left side outside tree composed of I8, P3, N2, and I4 and the right side composed of I11, P6, N5, and I7 are arranged as symmetrical bias voltage providers for the single handling inner trees. These outside biasing trees are designed for lower current, 0.25 ma, to save power. The inner signal trees are, on the left, I9, P4, N3, and I5 and on the right, I10, P5, N4 and I6. P4 and P5 are running at (with no differential input) at 0.5 ma each. The other 0.5 ma from I9 and I10 run through N0 and N1. These currents and the sizes of the components are only one preferred example and other sizes, current ranges and at other proportions may be used to advantage in the present invention.

Expanding on the symmetry discussion, in FIG. 3, following the circuitry from the input through to the output the circuitry is identical and symmetrical so that the loading on each transistor is equal to its mirror transistor. Moreover, the layout signal path lengths are designed to be virtually identical. This means that the transistor sizes and parameters, the capacitances, resistances and layout path lengths are all identical along both the IN+ and the IN− signal paths. This designed symmetry leads to minimized skew.

Jitter is an apparent signal riding on an actual differential signal causing variations in its period. One factor causing jitter is noise. One common source of noise is the power rail, Vdd. The circuit topology and component parameters are made symmetrical so that any signal riding on the power rail appears equally on both sides of the circuitry or in common mode and therefore its contribute to the differential signal is minimized. This factor is called the "power supply rejection ratio," which is the signal gain (output signal value divided by the input signal value "divided by a valued calculated from an output signal value due to a signal on the power rail—basically the gain from the power rail to the output).

Back to FIG. 3, it is instructive to follow a signal through the schematic. Here a differential signal at a common mode voltage of greater than Vdd/2 will be described traveling through the NMOS transistors, N0 and N1. There will be a corresponding equivalent signal path through P1 and P2 for common mode levels below Vdd/2.

For description purposes consider both inputs at Vdd/2 and both outputs at Vdd/2 also. This state will typically only exist transiently during switching but the distribution of currents will be clear from the circuitry and from there differential signals will be evident. In this condition, one half of I9 and I10 travel through N0 and N1 to match I0. And one half of I5 and I6 travel through P1 and P2 to match I1. The remaining one half of I9 supplies the one half of the remaining I5, and the remaining one half of I10 supplies the remaining one half of I6. I8 runs to I4 and I11 to I7.

Now, from FIG. 1, if IN+ is higher than IN− at some common mode voltage, more of I0 travels through N0 and less through N1. Therefore less of I9 will travel through P4 and more of I10 will travel through P5. With a large enough differential all of I0 travels through N0 and which is supplied from I9 leaving no current for P4, and correspondingly all on I10 travels through P5, pulling Vdif+ high. In this case, with matched current source, all of I6 accepts all of I10. In this case, also, all of I8 runs through P3 and N2 to I4. Under this condition, N3 is on and pulled low by I5 and so Vdiff− is lowered.

If the extreme case is not considered, the in the above analysis if IN+ is slightly higher than IN− the resultant analysis will drive more I9 current through N0 leaving less for P4, and more of I10 will travel through P5 and less through N1. The result of more current through P5 and N4 and less through P4 and N3, resulting in a higher Vdiff+ compared the Vdif An advantage of the input structure shown in FIGS. 1 and 2 is the available input common mode operation. Up this point the discussion considered a differential input and a differential output. But, each input signal is at some common voltage with respect to ground (gnd) and Vdd. So, for example if IN+ were at +1.25 volts (with respect to gnd) and if IN− were at 1.15 volts, the differential signal would be +100 millivolts, and the common mode voltage would be +1.2 volts. It is advantageous to design circuits which will operate over wide ranges of common mode voltages. A differential circuit with to power rail of +3.3 volts and gnd operates properly with an input common mode signal that could run from gnd to +3.3 volts would constitute a flexible circuit design. The use of the NMOS input circuitry of FIG.

1 and the PMOS circuitry of FIG. 2 allows this extensive input common mode.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A low voltage differential amplifier architecture with differential input and output signals, comprising, a first set of common source connected first NMOS transistors and parallel first PMOS transistors with their respective gates connected to the differential input signal, a first current source connected to the sources of the first NMOS transistors and a second current source connected to the sources of the first PMOS transistors, wherein the first set of first NMOS and parallel first PMOS transistors provide rail to rail input common mode range, the drains of the first NMOS connected to sources of a set of second PMOS transistors, the drains of the second PMOS connected to sources of a set of second NMOS transistors, wherein each set of second NMOS and second PMOS transistors are symmetric duplicates of each other, and wherein the drains of the set of second PMOS transistors are connected to the drains of the set of second NMOS transistors, wherein the voltage signal between the commonly connected drains define an output differential signal, a first biasing tree including a first tree PMOS transistor and a first tree NMOS transistor, with drains connected to each other, and each source connected to equal valued current sources, and wherein the gate of the first tree PMOS is connected to the gate of one of the set of second PMOS transistors and the gate of the first tree NMOS is connected to the gate of one of the set of second NMOS transistors, a second biasing tree including a second tree PMOS transistor and a second tree NMOS transistor, with drains connected to each other, and each source connected to equal valued current sources, and wherein the gate of the tree second PMOS is connected to the gate of the other of the set of second PMOS transistors and the gate of the second tree NMOS is connected to the gate of the other of the set of second NMOS transistors.

2. The circuit as defined in claim 1 wherein the arrangements of the corresponding sets of transistors and current sources are symmetrical with respect to each other and further comprising the circuit is laid out such that the current paths on either signal path side of the differential topology are identical to each other and further wherein impedances are equal to each other traveling on either signal path side of the differential circuit.

3. The circuit as defined in claim 1 further comprising parallel buffers each accepting one side of the output differential signal wherein the output of the inverters define a second differential output signal.

4. A low voltage differential amplifier architecture with differential input and output signals, comprising, parallel complementary common source first NMOS and first PMOS transistor pairs with their gates accepting the differential input signal, complementary current sources feeding the source of the first NMOS and first PMOS transistor pairs, the complementary current sources and first NMOS and first PMOS transistor pairs forming a differential input stage, and a second PMOS pair arranged to accept the drains of the first NMOS pair, a second NMOS pair arranged to accept the drains of the first PMOS pair, wherein the drains of the second NMOS pair are connected to the corresponding drains of the second PMOS pair, wherein the second NMOS and PMOS pairs form a folded cascode differential output stage, and a pair of stacked PMOS NMOS transistors with drains connected together and gates connect to the corresponding gates of the output cascode second NMOS and second PMOS pairs, thereby providing complementary biasing stacks for the output cascode second NMOS and second PMOS pairs.

5. The circuit as defined in claim 4 further comprising parallel buffers each accepting one side of the output differential signal wherein the output of the inverters define a second differential output signal.

* * * * *